United States Patent [19]

De Leeuw et al.

[11] Patent Number: 5,427,841
[45] Date of Patent: Jun. 27, 1995

[54] LAMINATED STRUCTURE OF A METAL LAYER ON A CONDUCTIVE POLYMER LAYER AND METHOD OF MANUFACTURING SUCH A STRUCTURE

[75] Inventors: Dagobert M. De Leeuw; Cornelius M. J. Mutsaers; Maurice M. J. Simenon, all of Eindhoven, Netherlands

[73] Assignee: U.S. Philips Corporation, New York, N.Y.

[21] Appl. No.: 203,104

[22] Filed: Feb. 28, 1994

[30] Foreign Application Priority Data

Mar. 9, 1993 [EP] European Pat. Off. ............ 93200665
Sep. 7, 1993 [EP] European Pat. Off. ............ 93202602

[51] Int. Cl.⁶ ............................................. B32B 9/00
[52] U.S. Cl. .................................. 428/209; 428/901; 526/268; 526/280; 526/286
[58] Field of Search ............... 428/209, 901; 526/268, 526/280, 286

[56] References Cited

U.S. PATENT DOCUMENTS 3,984,598  10/1976  Sarazin et al. .................... 428/209

FOREIGN PATENT DOCUMENTS 354569  1/1960  Japan .

OTHER PUBLICATIONS

"Influence of Chemicals Polymerization Conditions on the Properties of Polyaniline" Y. Cao et al, Polymer, 1989, vol. 30, Dec. 1989 pp. 2305–2311.

"The Application of Polypyrrole Precoat for the Metallization of Printed Circuit Boards" S. Gottesfeld et al, J. Electrochem. Soc. vol. 139, No. 1 Jan., 1992.

*Primary Examiner*—Patrick J. Ryan
*Assistant Examiner*—Kam F. Lee
*Attorney, Agent, or Firm*—Ernestine C. Bartlett

[57] ABSTRACT

A laminated structure (1) comprising a substrate (3) and a polymer layer (5) is provided. The polymer layer consists of conductive areas (7) having a sheet resistance of maximally 1000 $\Omega$/sqaure. The adjacent parts of the polymer layer are substantially non-conductive and have a sheet resistance which is a factor of $10^6$ higher. An electrodeposited metal layer (9), for example of copper, is present on the conductive areas (7).

A simple method of photochemically generating the conductive pattern (7) which can be reinforced in an aqueous metal-salt solution by electrodeposition of a metal layer (9) is also provided and most preferably the conductive pattern is inter alia, the patterned exposure of a layer of 3,4-ethylene dioxythiophene or polyaniline. The method can very suitably be used for the manufacture of metal patterns on insulating substrates, such as printed circuit boards.

14 Claims, 1 Drawing Sheet

LAMINATED STRUCTURE OF A METAL LAYER ON A CONDUCTIVE POLYMER LAYER AND METHOD OF MANUFACTURING SUCH A STRUCTURE

FIELD OF THE INVENTION

The invention relates to a laminated structure comprising an electrically insulating substrate carrying an electrically conductive polymer layer of a polymer having a sheet resistance of maximally 1000 $\Omega$/square, a metal layer being electrodeposited onto the electrically conductive polymer layer. The invention also relates to a method of manufacturing such a structure.

BACKGROUND OF THE INVENTION

Such structures are used as printed circuit boards, in which the metal layer (mostly copper) is provided in accordance with the desired conductive track pattern. The substrate material used is made of, for example, synthetic resin, a composite material such as glass fiber/epoxy, paper/phenolic resin or ceramic. The substrate material is generally flat and plate-shaped, although it may alternatively be formed by a flat or curved form of, for example, the synthetic resin housing of a domestic appliance or shaver.

A printed circuit board can be manufactured by providing a substrate with a copper foil via an adhesive layer. The copper foil is provided with a photoresist layer and, in succession, exposed to patterned radiation and developed, whereafter the undesired copper is removed in a chemical etching bath. For reasons relating to the protection of the environment, this method is less desirable. In accordance with another method, the substrate, which is non-conductive, is provided with a copper layer in an electroless process. To this end, the substrate is first activated with a noble metal, such as palladium, and then immersed in an electroless metallization bath. Such a bath contains an aqueous solution of, inter alia, a copper salt, a complexing agent such as EDTA, and a reducing agent such as formaldehyde. The copper layer provided in an electroless process is generally reinforced with a copper layer applied by means of electrodeposition. In this process an external current source is used to electrodeposit copper onto the copper layer forming the cathode from an aqueous copper-salt solution.

However, electroless metallization has the drawback that the activation is non-selective, so that the deposited uniform copper layer must subsequently be provided with a pattern in a photolithographic process and by means of chemical etching, which is very laborious. Another drawback is that expensive noble metals (such as palladium) are necessary to activate the substrate surface and that the metallization baths used readily become instable. Moreover, said metallization baths contain toxic components such as the above-mentioned complexing and reducing agents.

A laminated structure of the type mentioned in the opening paragraph is known from an article by S. Gottesgeld et all. in J. Electrochem. Soc. Vol. 139, No. 1, L14 (1992). The known structure is manufactured by providing a substrate with an electrically conductive polypyrrole layer. To this end the substrate is immersed in an aqueous solution of pyrrole and a ferri-salt. After an immersion time in this solution of at least 0.5 hour an electrically conductive polypyrrole layer having a specific conductivity of 60 S/cm is formed on the substrate. The sheet resistance is a few hundred $\Omega$/square. Although in general polymers are poor conductors, it is known that polymers comprising poly-conjugated chains have electrically conductive properties. Said conductivity is referred to as intrinsic conductivity. Examples of such polymers are: polyacetylene, polyaniline, polythiophene and polypyrrole. The conductivity of these polymers is generally low but it can be increased by, for example, (electro)chemically oxidizing, referred to as doping, the polymer, resulting in the formation of p-type conductors. Suitable dopants for obtaining p-type conduction are, for example, $I_2$, $AsF_5$, $SbF_5$, $HBF_4$, perchlorates, sulphonates, $SO_3$ and $FeCl_3$. This doping results in the formation of positive charge carriers on the polymer chains, which charges are compensated for by negatively charged counter-ions. The sheet resistance of the doped polypyrrole layer thus obtained is sufficiently low to provide this layer with a copper layer in an electrodeposition process.

A disadvantage of the known method is that the copper layer is nonselectively provided, so that it is still necessary to structure the uniform copper layer at a later stage to obtain the desired pattern. According to said article, the copper layer can be structured by removing the undesired polypyrrole from the substrate. The article does not indicate how this could be done; in any case, removal of undesired, conductive polypyrrole requires an additional process step.

SUMMARY OF THE INVENTION

It is an object of the invention to provide, inter alia, a laminated structure having a polymer layer which comprises a pattern of conductive and substantially non-conductive polymer, a metal layer being applied to the pattern of conductive polymer by electrodeposition. The invention also aims at providing a simple method of manufacturing such a laminated structure, which does not have the above-mentioned disadvantages, in particular a method in which no electroless metallization baths are used and in which metallization takes place selectively according to the desired pattern.

A laminated structure as described in the opening paragraph is characterized according to the invention in that a pattern of areas of substantially non-conductive polymer whose sheet resistance is at least a factor of $10^6$ higher than that of the conductive polymer is formed in the polymer layer, and said pattern is not provided with a metal layer. The invention is based on the insight that for growing a metal layer on a conductive polymer layer by electrodeposition, a maximum sheet resistance is required to obtain a minimum difference in layer thickness of the metal layer, and, in addition, for obtaining the desired pattern definition the sheet resistance of the parts of the polymer layer on which the metal layer is undesired must be at least a factor of $10^6$ higher than the sheet resistance of the conductive pans. This means that if the layer thicknesses of the conductive pans and the substantially non-conductive pans of the polymer layer are equal, the ratio of the respective sheet resistances is at least $10^6$. In particular for the manufacture of narrow metal tracks a low sheet resistance of the polymer pattern is important to electrodeposit metal in a uniform layer from a metal-salt solution. Too high an ohmic drop in the conductive polymer pattern during electrolysis causes a smaller metal deposition in areas which are further removed from the electrical connection point of the external current source. Pattern definition is important if metal tracks are located at a small distance (for example 0.5 mm) from each other. A high sheet resistance of areas situated between the satisfactorily conducting areas of the polymer layer precludes metal from being electrodeposited in these areas and hence undesired short-circuits between the metal tracks in subsequent applications.

For the substrate of the laminated structure in accordance with the invention use can be made of synthetic resins, glass, quartz, ceramic and composite materials such as glass fiber/epoxy (FR-4), paper/phenolic resin (FR-2) and paper/epoxy resin (FR-3). The substrate may be in the form of a separate pan or it may be integral with a housing pan, which may or may not be curved, of an electric device.

A suitable embodiment of the laminated structure in accordance with the invention is characterized in that the polymer layer comprises predominantly poly-3,4-ethylene dioxythiophene (PEDOT). In accordance with a method which will be described in detail hereinbelow, PEDOT can be manufactured both in a conductive and a substantially non-conductive state. In a typical example, conductive PEDOT has a specific conductivity of 300 S/cm and a sheet resistance of 470 $\Omega$/square at a layer thickness of 0.07 $\mu$m. The substantially non-conductive PEDOT has a sheet resistance of $1.4 \cdot 10^9$ $\Omega$/square and a specific conductivity of $10^{-4}$ S/cm. In addition to a high conductivity, conductive PEDOT layers have a great stability when exposed to UV-light ($\lambda > 300$ nm). The temperature stability of PEDOT is many times better than that of other known conductive polymers. The ethylene group of PEDOT can be substituted with a $C_1$-$C_2$ alkyl group or alkoxy group. These substituents improve the solubility of the EDOT monomers.

Another suitable embodiment of the laminated structure in accordance with the invention is characterized in that the polymer layer comprises predominantly polyaniline (PANI). In accordance with a method which will be explained in greater detail hereinbelow, PAN can be manufactured both in a conductive state and in a substantially non-conductive state. In a typical example, conductive PANI has a specific conductivity of 48 S/cm and a sheet resistance of 100 $\Omega$/square at a layer thickness of 2.1 $\mu$m. At the same layer thickness, the substantially non-conductive PANI has a sheet resistance of $10^9$ $\Omega$/square.

Copper is generally used for the metal layer of the track pattern because it has a satisfactory conductivity, solderability and many electroplating copper baths are available. Also other metals can be provided by electroplating, for example silver, nickel, chromium, tin, lead and alloys of said metals.

The invention also provides a simple method of manufacturing the above-mentioned laminated structure, which method is characterized in that a layer of a solution comprising 3,4-ethylene dioxythiophene monomers, an oxidation agent, a base and a solvent is provided on a substrate, whereafter the layer is exposed to patterned radiation and subsequently heated, thereby forming conductive polymer in the unexposed areas and substantially non-conductive polymer in the exposed areas, after which the metal layer is electrodeposited onto the conductive polymer from a metal-salt solution.

Solutions comprising monomers or undoped oligomers or polymers and typical oxidation agents which are used as dopants, such as Fe(III)-salts, are often instable. During the mixing of said components instantaneously doped polymers are formed in the solution, so that the formation of a conductive polymer pattern on a substrate becomes impossible. Surprisingly, it has been found that the reaction rate of the polymerization reaction and/or doping reaction is reduced by adding small quantities of a base to the solution. Dependent on the concentration of the base, the reaction can be completely suppressed at room temperature. If an effective base concentration is used, solutions comprising monomers, oligomers or polymers and a suitable oxidation agent can remain stable at room temperature for approximately 12 hours: no polymerization takes place. These stable solutions can be used to spin coat thin layers onto a substrate. After heating of the layer an electrically conductive polymer is formed. If prior to heating of the spin coated layer of monomers or oligomers, said layer is exposed to, for example, UV-light, surprisingly, a non-conductive polymer is formed after heating. If the spin coated layer is partially exposed to light, conductive polymer is formed in the unexposed areas and substantially non-conductive polymer (i.e. having a sheet resistance which is at least a factor of $10^6$ higher) is formed in the exposed areas after heating. In accordance with this method, patterned irradiation via, for example, a mask results in conductive polymer patterns in the unexposed areas and areas of insulating polymer in the exposed areas.

A solution of 3,4-ethylene dioxythiophene (EDOT) monomers, a suitable quantity of a base and an Fe(III)-salt as the oxidation agent is stable at room temperature. A layer of said solution can be applied to a substrate by spin coating, spraying or immersing. The layer is exposed to patterned radiation with deep UV-light ($\lambda < 300$ nm). Subsequently, the layer is heated to approximately 110° C., thereby initiating the polymerization reaction. A conductive polymer having a low sheet resistance is formed in the unexposed areas and substantially non-conductive polymer is formed in the areas exposed to deep UV-light. Subsequently, the layer is extracted with, for example, water, methanol or 1-butanol. As a result of said extraction the reduced oxidation agent, for example the Fe(II)-salt formed, is removed from the layer.

The sheet resistance obtained and the difference in sheet resistance between exposed and unexposed areas of a factor of at least $10^6$ are sufficient for attaining a selective reinforcement with a metal layer which is applied by electrodeposition.

The ethylene group of EDOT can be substituted with a $C_1$-$C_{12}$ alkyl group or alkoxy group to improve the solubility. Also oligomers of EDOT, which may or may not be substituted, such as the tetramer of EDOT-$C_6H_{13}$, may be used in the method in accordance with the invention.

Oxidation agents which can suitably be used in this method in accordance with the invention are, fur example, soluble Fe(III)-salts, such as tris(toluene sulphonate)Fe(III), Cu(II)-salts, such as $Cu(BF_4)_2$, and Ce(IV)-salts. An example of a suitable organic oxidation agent is 2,3-dichloro-5,6-dicyanoparabenzoquinone (DDQ). The choice of the oxidation agent is governed by the redox potential of the monomer, oligomer or polymer used. In order to be able to suppress the polymerization/doping reaction at room temperature, the redox potentials of the oxidation agent and the monomer, oligomer or polymer must not differ too much.

Suitable soluble bases for this method are, for example, imidazole, dicyclohexylamine and 1,8-diazabicyclo[5.4.0]undec-7-ene (DBU).

Another suitable method in accordance with the invention is characterized in that a layer of a solution comprising conductive polyaniline, a photochemical radical generator and a solvent is provided on the substrate, whereafter the layer is exposed to patterned radiation, thereby forming substantially non-conductive polymer in the exposed areas, and then heated, after which the metal layer is electrodeposited onto the conductive polyaniline from a metal-salt solution. It has been found that conductive polyaniline becomes substantially non-conductive if specific radicals are generated in said polyaniline. Said radicals can be obtained photochemically. Aliphatic phenylketones such as 1-benzoyl-1-cyclohexanol are very effective photochemical radical generators. The ratio between the sheet resistances of the exposed and the unexposed areas is above $10^7$, so that selective metallization of the unexposed areas is possible. Exposure takes place by irradiation with deep UV-light (wavelength<320 mm). In the heating step, unreacted radical generators are removed by evaporation.

The above-described methods both form a negative process: the exposed areas of the polymer layer become non-conductive.

A positive process can be obtained by using a solution which comprises monomers or oligomers, an oxidation agent, a base and a photochemical acid generator. By virtue of the base, the solution is stable at room temperature. By selectively exposing a layer of such a solution to UV-light, the photochemical acid generator generates protons which neutralize the base present. Said neutralization initiates the polymerization reaction, which leads to in situ doped conductive polymer in the exposed areas. Onium salts, such as triphenylsulphonium hexafluoroantimonate and biphenyliodonium hexafluorophosphate, can be used as the photochemical acid generator. Aromatic compounds, such as aniline, and heterocyclic aromatic compounds, such as pyrrole, furan and thiophene, can be used as the monomers. To increase the solubility and improve the processability, said monomers may be substituted with, for example, alkyl groups or alkoxy groups. An example of such a compound is 3-dodecylthiophene. Suitable oligomers are, for example, terthiophene and α,α'-coupled undecathiophene substituted with four dodecyl side chains, in literature referred to as $T_{12}d_4(2,5,8,11)$, i.e. 12 thiophene rings ($T_{12}$) with 4 dodecyl side chains ($d_4$) on the rings 2,5,8 and 11. The above-mentioned compounds can be used as oxidation agents and bases.

The method in accordance with the invention enables a metal layer to be selectively electrodeposited onto a substrate in a simple manner, without using an electroless metallization bath and without photolithographic etching treatment.

BRIEF DESCRIPTION OF THE DRAWINGS

The invention will be explained in greater detail by means of exemplary embodiments and drawings, in which.

DETAILED DESCRIPTION OF THE PREFERRED EMBODIMENTS

Exemplary embodiment 1

Figure 1:
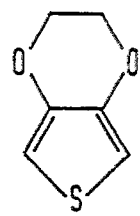
FIG. 1 is the structural formula of 3,4-ethylene dioxythiophene (EDOT)

A quantity of 0.35 mmol of 3,4-ethylene dioxythiophene (EDOT, supplier Bayer AG, formula see FIG. 1) is mixed with a solution of 0.81 mmol of tris(toluene sulphonate)Fe(III) and 0.25 mmol of imidazole in 1.5 g of 1-butanol. The solution obtained is stable for approximately 12 hours at room temperature. Said solution is passed through a 0.5 μm filter.

Figure 2:
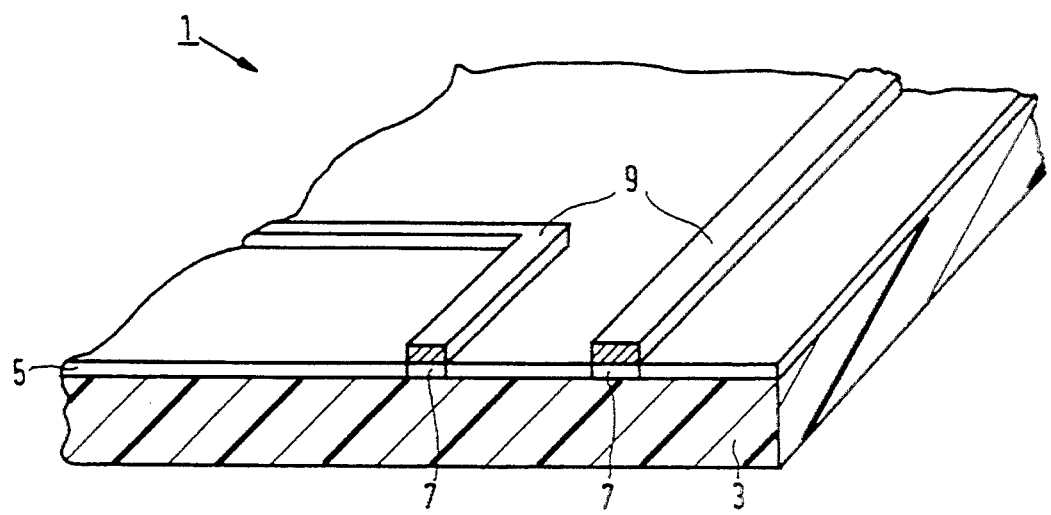
FIG. 2 is a perspective sectional view of a part of a laminated structure in accordance with the invention.

FIG. 2 is a perspective sectional view of a part of a laminated structure 1 in accordance with the invention. Said Figure shows a polymethyl methacrylate substrate 3 onto which a layer 5 of the above-mentioned solution is provided by spin coating. The layer 5 obtained is dried at 50° C. for 3 minutes. The layer 5 is exposed, via a mask, to patterned radiation with UV-light ($\lambda<300$ nm) by means of a Hg lamp, the areas 7 remaining unexposed. Subsequently the layer 5 is heated to 110° C. for 1 minute. After cooling, the Fe(II)-salt formed is extracted from the layer by means of 1-butanol. After extraction, the average layer thickness is 0.07 μm. The unexposed parts 7 of the layer 5 comprise electrically conductive poly-3,4-ethylene dioxythiophene having a sheet resistance of 470 Ω/square, from which the specific conductivity can be calculated to be 300 S/cm. The exposed parts of the layer comprise a non-conductive polymer having a sheet resistance of $1.4 \cdot 10^9$ Ω/square. The, sheet resistance is determined by means of a four-probe measurement.

Both the conductive and the non-conductive polymer are transparent to visible fight. The in situ doped conductive polymer is surrounded by areas of non-conductive polymer, so that further planarization steps are superfluous. The conductive patterns are stable in UV-light ($\lambda>300$ nm) and, in addition, have a higher thermal stability than the conductive polymers known to date.

The conductive pattern is subsequently copper-plated in an aqueous copper bath comprising 0.5 mol/l of $CuSO_4$ and 0.5 mol/l of $H_2SO_4$ at room temperature. The current density is 0.1 A/cm². A copper pattern 9 is deposited only on the conductive (i.e. unexposed) pans 7 of the polymer layer 5. The adhesion of the copper layer to the polymer layer passes the tape-test.

Exemplary Embodiment 2

Conductive polyaniline is prepared by adding an aqueous solution of $(NH_4)_2SO_8$ to a hydrochloric acid solution of aniline. The precipitated polyaniline is filtered-off and washed with water. This synthesis is described in an article by Y. Cao et al. in Polymer, 30, 2305–2311 (1989). A quantity of 2 g of a solution is prepared which consists of 0.5 wt. % of conductive polyaniline in m-cresol. A quantity of 0.15 g of 1-benzoyl-1-cyclohexanol is added to this solution. The solution is spin coated onto a glass substrate. The polymer layer obtained is dried at 90° C. for 1 minute. The thickness of the polymer layer is 2.1 μm. Subsequently the dried polymer layer is exposed to patterned radiation with deep UV-light in a nitrogen atmosphere. The unexposed parts of the polymer layer have a sheet resistance of 100 Ω/square (calculated specific conductivity 48 S/cm), whereas the exposed parts have a value in excess of $10^9$ Ω/square. Subsequently, copper from the electroplating bath of exemplary embodiment 1 is deposited on the unexposed areas of the polymer layer. In this manner, copper tracks having a width of 0.5 mm are produced.

The same result is obtained if polycresol formaldehyde (Bakelite TM) is used as the substrate material.

The method in accordance with the invention enables polymer patterns to be photochemically produced in a polymer layer, the sheet resistance of the conductive parts of the polymer pattern being maximally 1000 $\Omega$/square and, in addition, a factor of at least $10^6$ lower than the sheet resistance of the unexposed parts. In accordance with the invention, the conductive polymer pattern can be selectively provided with a metal layer by electrodeposition, thereby forming a corresponding metal pattern. Thus, the method in accordance with the invention can very suitably be used for the additive manufacture of metal patterns and, hence, is a favourable alternative to electroless metallization.

We claim:

1. A laminated structure comprising an electrically insulating substrate carrying a polymer layer comprising electrically conductive portions having a sheet resistance of maximally 1000 $\Omega$/square, and a pattern of second substantially non-conductive portions whose sheet resistance is at least a factor of $10^6$ higher than that of the conductive polymer in said first portions, a metal layer being electrodeposited onto the electrically conductive first portions of said polymer layer.

2. A laminated structure as claimed in claim 1, wherein the polymer layer comprises a polymer selected from the group of poly-3,4-ethylene dioxythiophene and substituted and unsubstituted derivatives thereof.

3. A laminated structure as claimed in claim 1, wherein the polymer layer comprises a polyaniline polymer.

4. A laminated structure as claimed in claim 1, wherein the metal layer comprises copper.

5. A laminated structure comprising an electrically insulating substrate carrying a polymer layer consisting essentially of a polymer selected from the group of poly-3,4-ethylene dioxythiophene, poly-3,4-ethylene dioxythiophene wherein the ethylene group is substituted with a $C_1$–$C_{12}$ alkyl group, poly-3,4-ethylene dioxythiophene wherein the ethylene group is substituted with an alkoxy group, and oligomers of ethylene dioxythiophene, said layer having first electrically conductive portions having a sheet resistance of maximally 1000 $\Omega$/square, and a pattern of second substantially non-conductive portions whose sheet resistance is at least a factor of $10^6$ higher than that of the conductive polymer in said first portions, a metal layer being deposited into the electrically conductive first portions of said polymer layer.

6. A laminated structure comprising an electrically insulating substrate carrying polymer layer consisting essentially of a polyaniline polymer, said layer having first electrically conductive portions having a sheet resistance of maximally 1000 $\Omega$/square, and a pattern of second substantially non-conductive portions whose sheet resistance is at least a factor of $10^6$ higher than that of the conductive polymer in said first portions, a metal layer being deposited on the electrically conductive first portions of said polymer layer deposited.

7. A room temperature stable spin coating solution which comprises a substance selected from the group of monomers, oligomers and polymers selectively polymerizable (a) to an electrically conductive polymer having a sheet resistance of maximally 1000 $\Omega$/square; (b) to an electrically non-conductive polymer; and (c) to a polymer having conductive and non-conductive areas; said solution further including an oxidation agent; a base; and a solvent.

8. A room temperature stable coating solution as claimed in claim 7 wherein said substance is selected from the group of poly-3,4-ethylene dioxythiophene, poly-3,4-ethylene dioxythiophene wherein the ethylene group is substituted with a $C_1$–$C_{12}$ alkyl group, poly-3,4-ethylene dioxythiophene wherein the ethylene group is substituted with an alkoxy group, and oligomers of ethylene dioxythiophene.

9. A room temperature stable coating solution as claimed in claim 7 wherein said oxidation agent is a Fe(III)-salt.

10. A room temperature stable coating solution as claimed in claim 9 wherein said base is selected from the group of imidazole, dicyclohexylamine and 1,8-diazabicyclo[5.4.0]undec-7-ene.

11. A room temperature stable coating solution as claimed in claim 7 wherein said solution additionally contains a photochemical radical generator.

12. A room temperature stable spin coating solution as claimed in claim 11 wherein said substance is a polyaniline polymer and said photochemical radical generator is an aliphatic phenylketone.

13. A room temperature stable spin coating solution as claimed in claim 7 wherein said solution additionally contains a photochemical acid generator.

14. A room temperature stable spin coating solution as claimed in claim 13 wherein photochemical acid generator is an onium salt.

* * * * *